(12) United States Patent
Chang

(10) Patent No.: US 8,496,047 B2
(45) Date of Patent: Jul. 30, 2013

(54) HEAT DISSIPATING APPARATUS EXTENDED LATERALLY FROM HEAT PIPE

(75) Inventor: Cheng-Yi Chang, Chung-Ho (TW)

(73) Assignee: Chemtron Research LLC, Dover, DE (US)

( * ) Notice: Subject to any disclaimer, the term of this patent is extended or adjusted under 35 U.S.C. 154(b) by 668 days.

(21) Appl. No.: 12/345,956

(22) Filed: Dec. 30, 2008

(65) Prior Publication Data

US 2009/0173474 A1 Jul. 9, 2009

(30) Foreign Application Priority Data

Jan. 7, 2008 (TW) ................................ 97200407 U

(51) Int. Cl.
*F28F 7/00* (2006.01)
*F28D 15/00* (2006.01)
*H05K 7/20* (2006.01)

(52) U.S. Cl.
USPC .................. 165/80.2; 165/104.21; 361/700

(58) Field of Classification Search
USPC . 165/104.33, 80.2, 80.3, 104.21; 361/679.52, 361/697, 700
See application file for complete search history.

(56) References Cited

U.S. PATENT DOCUMENTS

| | | | | |
|---|---|---|---|---|
| 5,926,370 A | * | 7/1999 | Cromwell | 361/700 |
| 5,959,837 A | * | 9/1999 | Yu | 361/697 |
| 6,778,390 B2 | * | 8/2004 | Michael | 361/695 |
| 6,880,346 B1 | * | 4/2005 | Tseng et al. | 62/3.7 |
| 7,028,758 B2 | * | 4/2006 | Sheng et al. | 165/104.21 |
| 2007/0044944 A1 | * | 3/2007 | Lin | 165/104.33 |

* cited by examiner

*Primary Examiner* — Allen Flanigan
*Assistant Examiner* — Jason Thompson
(74) *Attorney, Agent, or Firm* — Turocy & Watson, LLP

(57) ABSTRACT

A heat dissipating apparatus includes a thermal conducting base and heat pipes connected to the thermal conducting base. Each heat pipe includes a heated section and a heat dissipating section. The portion connected to the thermal conducting base is the heated section, and the heat dissipating section is extended outward from the thermal conducting base. In the heat pipes, at least one heat dissipating section of the heat pipe is extended outward from a lateral side of the thermal conducting base, and the heat dissipating section of the heat pipe is situated at a position higher than the heated section, and fins are disposed on the heat dissipating section of the heat pipe. Therefore, the heat pipe guides the heat absorbed by thermal conducting base to a lateral side to dissipate heat from a nearby heat source.

20 Claims, 5 Drawing Sheets

HEAT DISSIPATING APPARATUS EXTENDED LATERALLY FROM HEAT PIPE

BACKGROUND OF THE INVENTION

1. Field of the Invention

The present invention generally relates to a heat dissipating apparatus, and more particularly to a heat dissipating apparatus capable of solving the problem of dissipating heat energy generated by a heat-generating electronic component such as a CPU and its peripheral components.

2. Description of Prior Art

Heat dissipating apparatus used for dissipating the heat of a heat-generating electronic component is a well-known prior art, and a traditional heat dissipating apparatus is generally comprised of a thermal conducting base in contact with a heat source and a plurality of fins disposed on the thermal conducting base, such that the surface area of each fin can be used for increasing the overall heat dissipating area. If the fins are made of materials of the same coefficient of heat dissipation, the greater the number of fins, the larger is the heat dissipating area, and the better is the heat dissipating effect of the heat dissipating apparatus.

While the number of fins is increased, the heat pipe is used for connecting the thermal conducting base and the plurality of fins, such that the heat pipe having the high thermal conducting characteristic can conduct the heat absorbed by the thermal conducting base to each fin to prevent the thermal conducting base from accumulating excessive heat and unable to further absorb the heat generated by the heat source. In the traditional heat pipe used for improving the heat dissipating effect of the heat dissipating apparatus, an end of the heat pipe is generally connected onto the thermal conducting base, and another end is extended vertically outward from a lateral side of the thermal conducting base. The portion of the heat pipe connected to the thermal conducting base is a heated section, and the portion of the heat pipe extended vertically outward is a heat dissipating section. The heat dissipating section of the heat pipe is substantially erected to connect the fins directly or further bent transversally inward, such that the heat dissipating section of the heat pipe is situated precisely at the top of the heated section, and the heat pipe is substantially n-shaped, and the heat dissipating section of the heat pipe is connected in series with the fins.

However, such heat dissipating apparatus has a heat pipe extended from the direction of its height, and the design facilitates the installation of a fan onto the fin, and the fan provides a cold air flowing vertically downward to improve the heat dissipating effect, but such arrangement can dissipate heat for a single heat source only. Although a fan with a larger size can be used for increasing the heat dissipating area blown by the airflow, such arrangement still cannot meet the heat dissipating requirement for the heat sources including peripheral electronic devices other than the CPU or even the memory of the computer motherboard due to the limitation of the size of the fan. Therefore, the prior art cannot achieve the effect of integrating the heat dissipating requirement for each heat source on the computer motherboard.

In view of the foregoing shortcomings of the prior art, the inventor of the present invention based on years of experience in the related industry to conduct extensive researches and experiments, and finally developed a reasonable and feasible heat dissipating apparatus to overcome the shortcomings of the prior art.

SUMMARY OF THE INVENTION

It is a primary objective of the present invention to provide a heat dissipating apparatus extended laterally from a heat pipe, wherein a transversally extended heat pipe is used for conducting heat generated by a heat source to a lateral side of the heat dissipating apparatus, such that the heat produced by a main heat source of the electronic device or other related secondary heat sources are dissipated, and thus the heat dissipating apparatus provides a heat dissipating effect for a plurality of heat sources.

To achieve the foregoing objectives, the present invention provides a heat dissipating apparatus extended laterally from a heat pipe, comprising a thermal conducting base and a plurality of heat pipes connected onto the thermal conducting base. Each heat pipe has a heated section and a heat dissipating section, and the portion connected to the thermal conducting base is the heated section, and the heat dissipating section is extended outward from the thermal conducting base, wherein at least one heat dissipating section of the heat pipes is extended transversally outward from a lateral side of the thermal conducting base, and the heat dissipating section of the heat pipe is situated at a position higher than the heated section, and a plurality of fins are disposed on the heat dissipating section of the heat pipe, such that the heat pipe can conduct the heat absorbed by the thermal conducting base to a lateral side to achieve the aforementioned effect.

DETAILED DESCRIPTION OF THE INVENTION

The technical characteristics, features and advantages of the present invention will become apparent in the following detailed description of preferred embodiments with reference to the accompanying drawings, and the preferred embodiments are used for illustrating the present invention only, but not intended to limit the scope of the invention.

Figure 1:
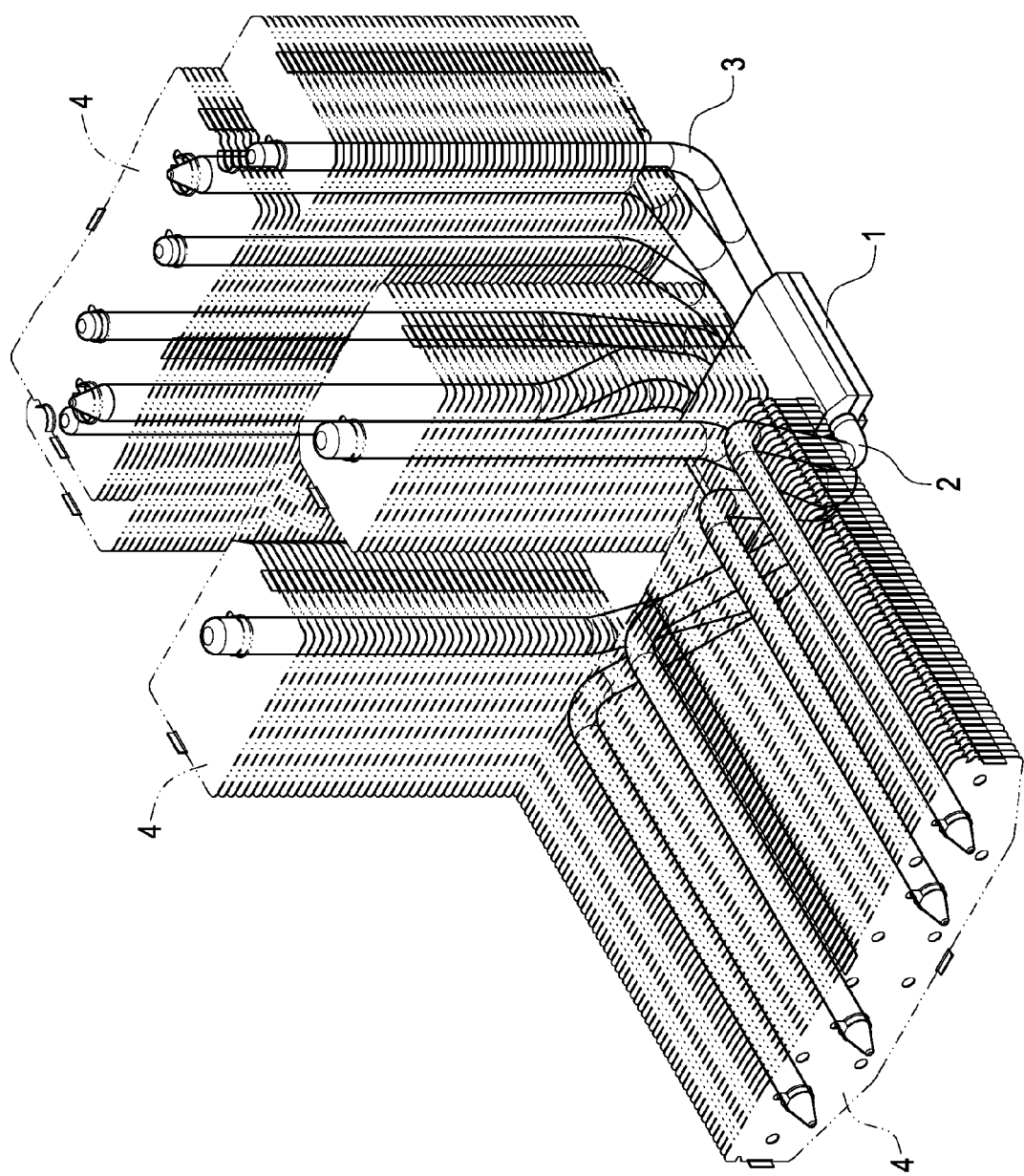
FIG. 1 is a perspective view of the present invention.
Figure 2:
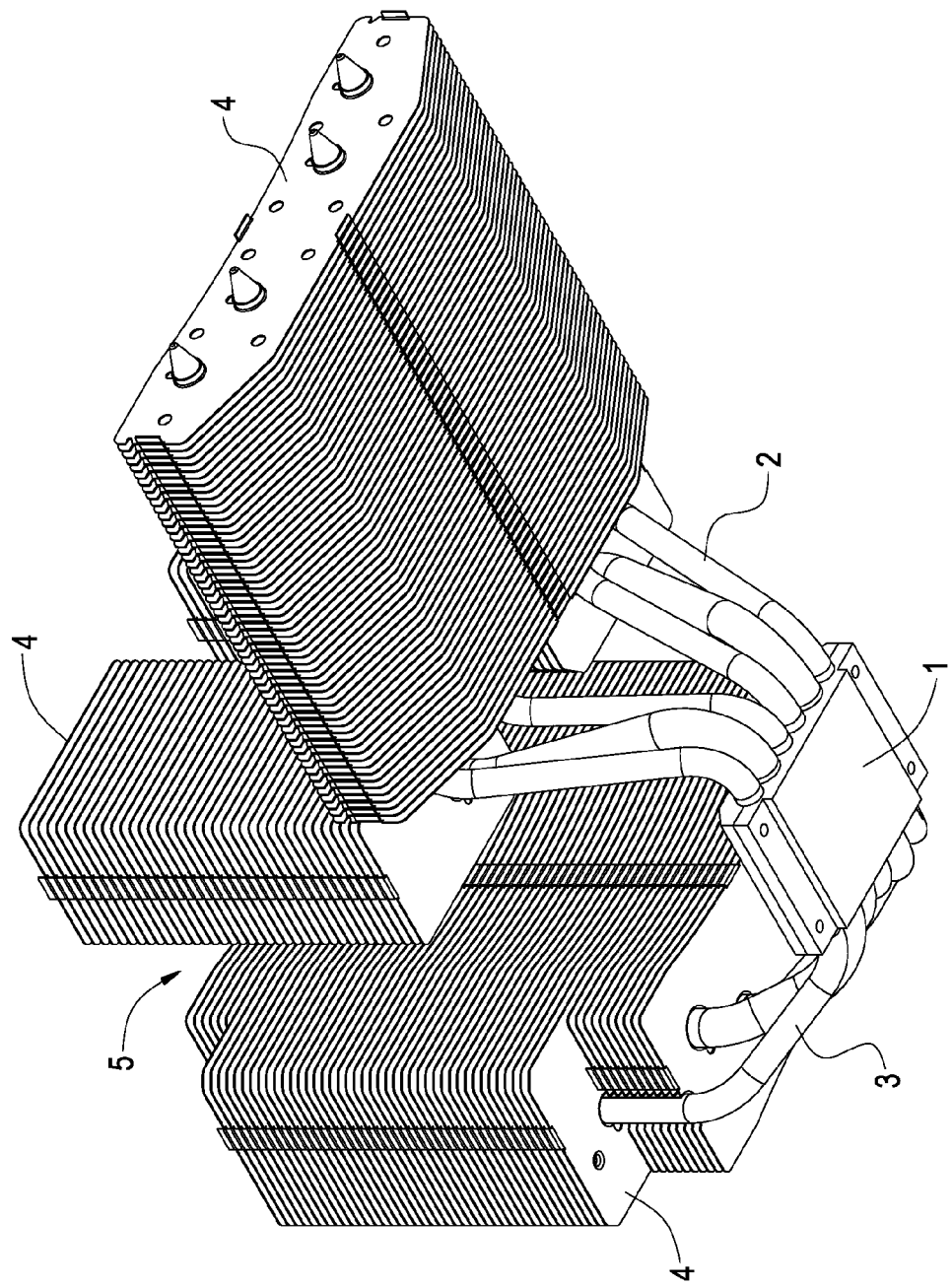
FIG. 2 is a perspective view of the present invention viewed at another viewing angle.

With reference to FIGS. 1 and 2 for perspective views of the present invention, a heat dissipating apparatus extended laterally from a heat pipe comprises a thermal conducting base 1 and a plurality of heat pipes 2, 3 connected onto the thermal conducting base 1.

Figure 5:
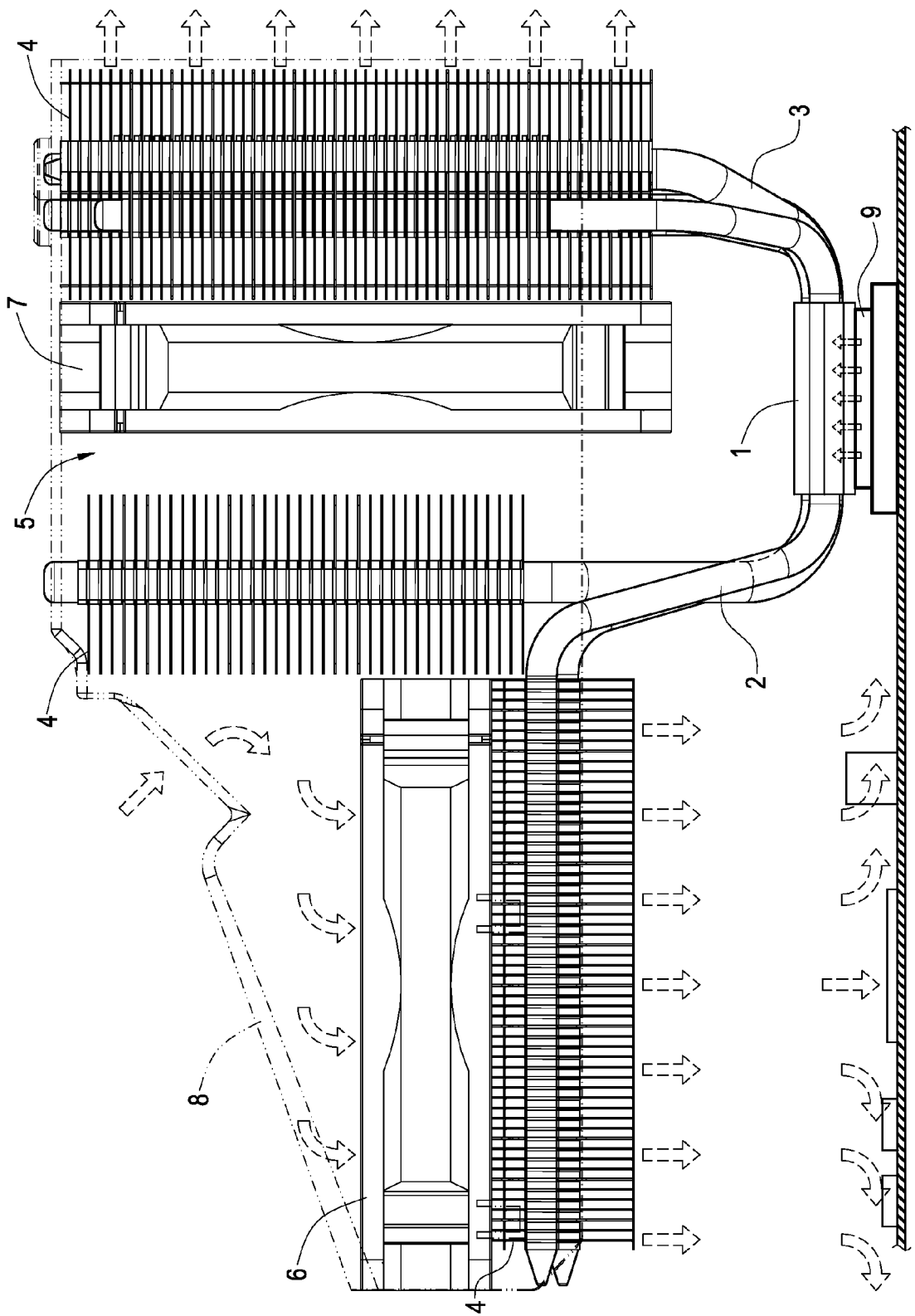
FIG. 5 is a schematic view of an application as depicted in FIG. 4.

The thermal conducting base 1 is substantially slab-shaped and made of a good conducting material such as aluminum or copper The bottom of the thermal conducting base 1 is provided for attaching a heat-generating electronic component 9 such as a CPU (as shown in FIG. 5).

Each of the heat pipes 2, 3 has a heated section and a heat dissipating section, and the heated section of each of the heat pipes 2, 3 is connected onto the thermal conducting base 1 for conducting heat, and the heat dissipating section of each heat pipe 2, 3 comes with different curved shaped depending on different thermal conducting paths.

Figure 3:
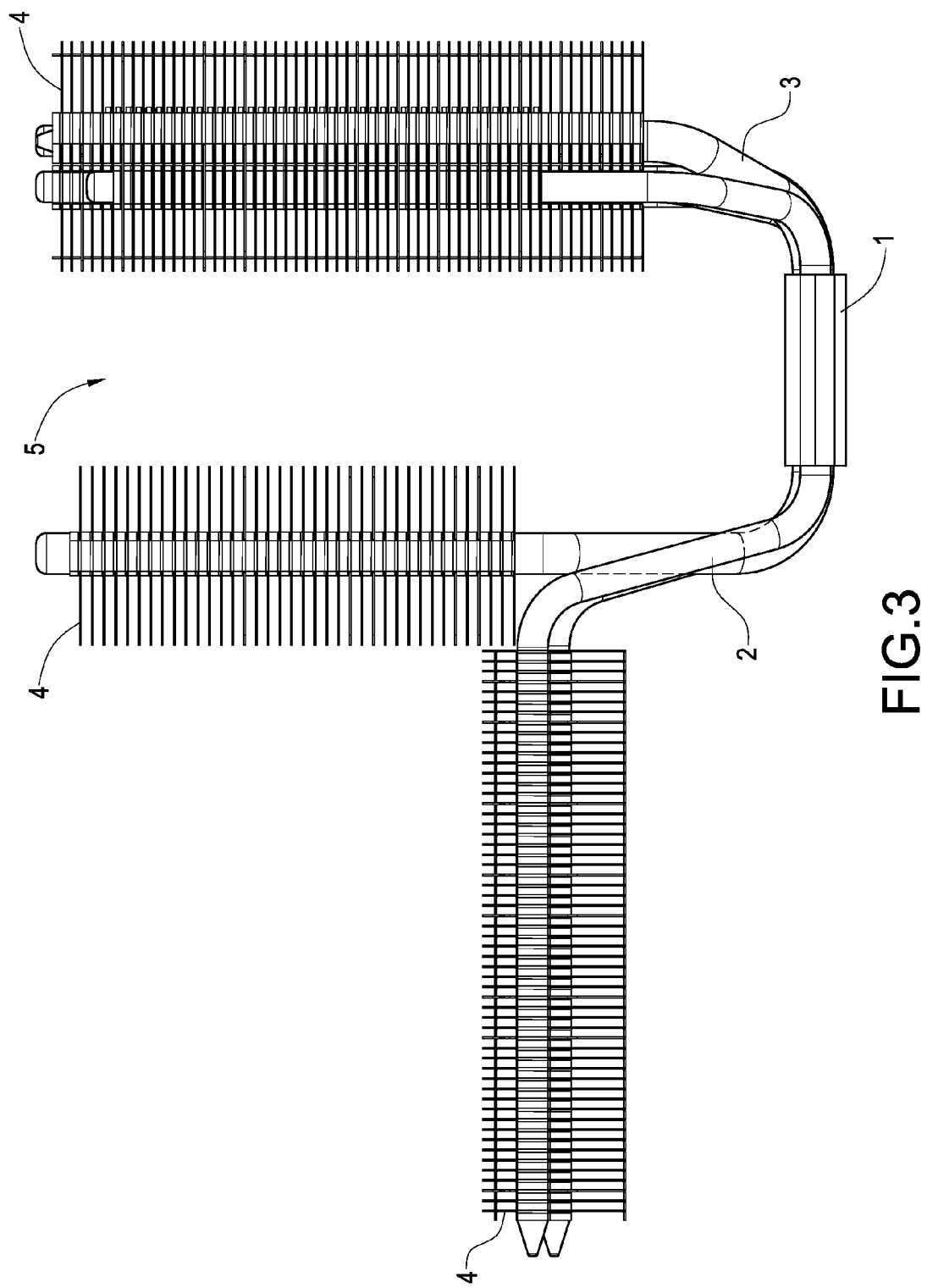
FIG. 3 is a side view of the present invention.

In FIG. 3, the heat dissipating section of at least one heat pipe (for example, heat pipe 2) is extended transversally outward from a lateral side of the thermal conducting base 1, and a plurality of fins 4 are disposed on the heat dissipating section of the heat pipe 2 and at a position higher than the heated section. The heat dissipating section of other heat pipes 3 is extended vertically, and the fins 4 are extended vertically on the heat dissipating section. In a preferred embodiment of the present invention, the heat dissipating section is an vertically extended heat pipe 3 substantially U-shaped, such that both ends of the U-shaped heat pipe 3 serve as the heat dissipating sections, and the fins 4 are connected onto the heat dissipating section in series, and a containing space 5 is defined between two serially connected fins 4 on the heat dissipating section.

Figure 4:
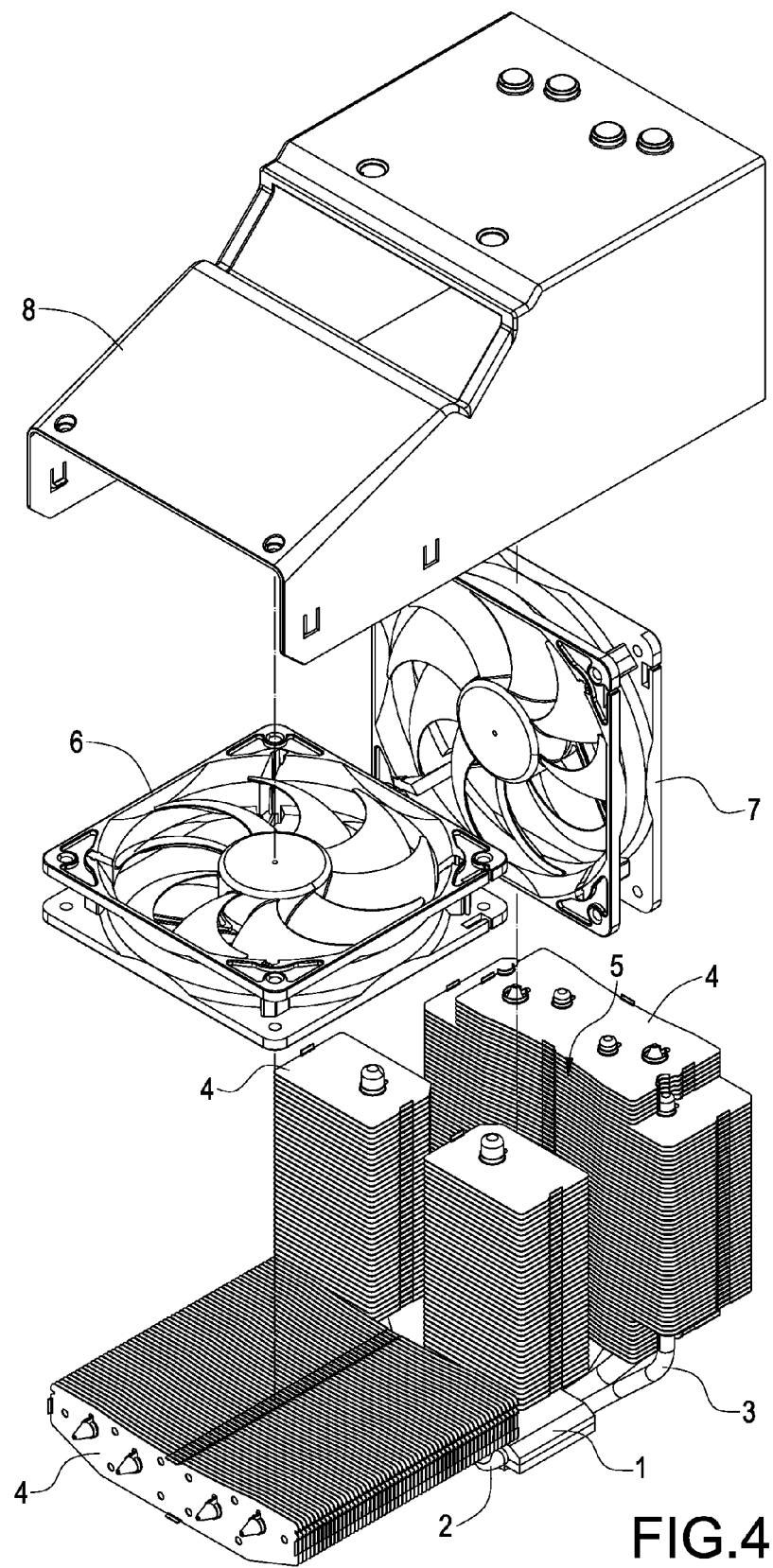
FIG. 4 is an exploded view of a fan and a hood installed in the present invention.

In FIG. 4, another fan 7 can be installed in the containing space 5, in addition to the fan 6 installed on the heat dissipating section of the transversally extended heat pipe 2, such that cold air can be provided for a compulsory heat dissipation according to the heat pipes 2, 3 in different curved shape, and a hood 8 is installed and covered onto the heat dissipating apparatus. In the meantime, the fan 6 mounted onto the transversally extended heat pipe 2 not only can be installed on top of each fin 4 of the heat pipe 2 as shown in the figure, but also can be installed at the bottom (not shown in the figure) for getting closer to the heat sources of the peripherals.

In FIG. 5, if the thermal conducting base 1, when the heat dissipating apparatus is attached onto a heat-generating electronic component 9 such as a CPU, the transversally extended heat pipe 2 is situated at the top of the electronic devices installed onto the heat-generating electronic component 9 or other related secondary heat sources to meet the heat dissipating requirement, or even extended to the top of a memory of a computer motherboard (not shown in the figure) to achieve the heat dissipating requirement, for the heat-generating electronic components such as the CPU and the memory of the computer through the heat dissipating apparatus to achieve the effect of meeting the providing heat dissipating requirement for a plurality of heat sources.

The aforementioned structure constitutes a heat dissipating apparatus extended laterally from a heat pipe in accordance with the present invention.

In summation of the description above, the invention complies with patent application requirements, and is duly filed for patent application. While the invention has been described by means of specific embodiments, numerous modifications and variations could be made thereto by those skilled in the art without departing from the scope and spirit of the invention set forth in the claims.

What is claimed is:

1. An apparatus, comprising:
    at least one heated section of a plurality of heat pipes, wherein the at least one heated section of the plurality of heat pipes is coupled to a thermal conducting base;
    a first heat dissipating section coupled to at least one heat pipe of the plurality of heat pipes, wherein the first heat dissipating section extends transversally outward from a lateral side of the thermal conducting base;
    a second heat dissipating section coupled to the at least one heat pipe of the plurality of heat pipes and at least one other heat pipe of the plurality of heat pipes, wherein the second heat dissipating section extends vertically outward from the thermal conducting base; and
    a third heat dissipating section coupled to the at least one other heat pipe, wherein the third heat dissipating section extends vertically outward from the thermal conducting base, and wherein the first heat dissipating section, the second heat dissipating section and the third heat dissipating section are situated at a position higher than the at least one heated section.

2. The apparatus of claim 1, wherein the plurality of heat pipes comprise two or more differently shaped heat pipes.

3. The apparatus of claim 1, wherein the at least one other heat pipe of the plurality of heat pipes includes two heat pipes formed as U-shaped heat pipes with a containing space defined between the two heat pipes, wherein a fan is installed in the containing space.

4. The apparatus of claim 3, further comprising a hood installed and covered onto the fan.

5. The apparatus of claim 1, wherein a fan is installed on the first heat dissipating section.

6. The apparatus of claim 5, further comprising a hood installed and covered onto the fan.

7. The apparatus of claim 3, wherein another fan is installed on the first heat dissipating section.

8. The apparatus of claim 7, further comprising a hood installed and covered onto the apparatus.

9. The apparatus of claim 1, wherein the first heat dissipating section dissipates heat from the thermal conducting base and a fan coupled to the first heat dissipating section provides air to a plurality of heat sources separate from the thermal conducting base.

10. A device, comprising:
    one or more first heat pipes that include a first heated section coupled onto a thermal conducting base, a first heat dissipating section extended transversally outward from the thermal conducting base and a second heat dissipating section extended vertically outward from the thermal conducting base, wherein the first heat dissipating section is positioned higher than the first heated section; and
    one or more second heat pipes that include a second heated section coupled onto the thermal conducting base, the second heat dissipating section extended vertically outward from the thermal conducting base and a third heat dissipating section extended vertically outward from the thermal conducting base, wherein the second heat dissipating section is positioned higher than the second heated section.

11. The device of claim 10, wherein the first heat dissipating section, the second heat dissipating section and the third heat dissipating section include a plurality of fins.

12. The device of claim 10, wherein the one or more first heat pipes and the one or more second heat pipes comprise different predetermined curved shapes.

13. The device of claim 10, wherein the first heat dissipating section dissipates heat from the thermal conducting base and a fan coupled to the first heat dissipating section provides air to a plurality of heat sources separate from the thermal conducting base.

14. The device of claim 10, wherein the one or more second heat pipes includes two heat pipes formed as U-shaped heat pipes with a containing space defined between the two heat pipes, wherein a fan is installed in the containing space.

15. The device of claim 10, wherein a fan is installed on the first heat dissipating section.

16. A method, comprising:
    dissipating heat from a first heated section coupled to a thermal conducting base to a first heat dissipating section and a second heat dissipating section via one or more first heat pipes, wherein the first heat dissipating section extends transversally outward from the thermal conducting base, the second heat dissipating section extends vertically outward from the thermal conducting base and the first heat dissipating section is located at a position higher than the first heated section; and
    dissipating heat from a second heated section coupled to the thermal conducting base to the second heat dissipating section and a third heat dissipating section via one or more second heat pipes, wherein the third heat dissipating section extends vertically outward from the thermal conducting base and the second heat dissipating section is located at a position higher than the second heated section.

17. The method of claim 16, further including dissipating heat from one or more heat sources coupled to the thermal conducting base via the one or more first heat pipes and the one or more second heat pipes.

18. The method of claim 16, wherein the dissipating heat from the first heat dissipating section includes using a fan installed on the first heat dissipating section.

19. The method of claim 16, wherein the dissipating heat from the second heat dissipating section includes using a fan installed in a containing space formed by the one or more second heat pipes.

20. A system, comprising:
   means for dissipating heat from a first heated section coupled to a thermal conducting base to a first heat dissipating section and a second heat dissipating section via one or more first heat pipes, wherein the first heat dissipating section extends from the thermal conducting base in a horizontal direction, the second heat dissipating section extends from the thermal conducting base in a vertical direction and the first heat dissipating section is situated at a position higher than the first heated section; and
   means for dissipating heat from a second heated section coupled to the thermal conducting base to the second heat dissipating section and a third heat dissipating section via one or more second heat pipes, wherein the third heat dissipating section extends from the thermal conducting base in a vertical direction and the second heat dissipating section is situated at a position higher than the second heated section.

* * * * *